United States Patent
Adam et al.

(10) Patent No.: US 8,728,897 B2
(45) Date of Patent: May 20, 2014

(54) POWER SIGE HETEROJUNCTION BIPOLAR TRANSISTOR (HBT) WITH IMPROVED DRIVE CURRENT BY STRAIN COMPENSATION

(75) Inventors: Thomas N. Adam, Slingerlands, NY (US); David L. Harame, Essex Junction, VT (US); Qizhi Liu, Lexington, MA (US); Alexander Reznicek, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 13/342,797

(22) Filed: Jan. 3, 2012

(65) Prior Publication Data
US 2013/0168820 A1    Jul. 4, 2013

(51) Int. Cl.
*H01L 21/336*    (2006.01)

(52) U.S. Cl.
USPC .............. 438/312; 357/565; 357/E21.371; 357/E29.174

(58) Field of Classification Search
USPC ............ 257/565, E21.371, E29.174; 438/312
See application file for complete search history.

(56) References Cited

U.S. PATENT DOCUMENTS

| | | |
|---|---|---|
| 5,227,329 A | 7/1993 | Kobayashi et al. |
| 5,266,504 A | 11/1993 | Blouse et al. |
| 5,316,958 A | 5/1994 | Meyerson |
| 5,773,340 A | 6/1998 | Kumauchi et al. |
| 6,180,478 B1 | 1/2001 | Lee et al. |
| 6,316,795 B1 | 11/2001 | Croke, III |
| 6,670,654 B2 | 12/2003 | Lanzerotti et al. |
| 6,709,941 B2 | 3/2004 | Fujimaki |
| 6,750,484 B2 | 6/2004 | Lippert et al. |
| 6,972,441 B2 | 12/2005 | Shaheed |
| 6,977,398 B2 | 12/2005 | Coolbaugh et al. |
| 7,049,681 B2 | 5/2006 | Ohnishi et al. |
| 7,897,495 B2 | 3/2011 | Ye et al. |
| 2002/0096742 A1 | 7/2002 | Voldman |
| 2004/0087097 A1 | 5/2004 | Lai et al. |
| 2006/0040453 A1 | 2/2006 | Bock et al. |
| 2006/0115934 A1 | 6/2006 | Kim et al. |
| 2006/0292809 A1 | 12/2006 | Enicks et al. |
| 2012/0064674 A1* | 3/2012 | Sandhu et al. ................. 438/127 |

OTHER PUBLICATIONS

F. Brossard et al., "Improved Carbon Incorporation in Selective Epitaxial Growth of SiGe:C for HBT Applications", SiGe Technology and Device Meeting, 2006, ISTDM 2006, Third International, Publication Year: 2006, IEEE, 2 pages.

H. J. Osten et al., "Carbon doped SiGe heterojunction bipolar transistor module suitable for integration in a deep submicron CMOS process", Microwave Conference, 2000 Asia-Pacific, Publication Year: 2000, 6 pages.

* cited by examiner

*Primary Examiner* — Elias M Ullah
(74) *Attorney, Agent, or Firm* — Michael LeStrange; Roberts Mlotkowski Safran & Cole, P.C.

(57) ABSTRACT

A power SiGe heterojunction bipolar transistor (HBT) with improved drive current by strain compensation and methods of manufacture are provided. A method includes adding carbon in a continuous steady concentration in layers of a device including a subcollector layer, a collector layer, a base buffer layer, a base layer, and an emitter buffer layer.

17 Claims, 4 Drawing Sheets

POWER SIGE HETEROJUNCTION BIPOLAR TRANSISTOR (HBT) WITH IMPROVED DRIVE CURRENT BY STRAIN COMPENSATION

FIELD

The invention relates to semiconductor structures and methods of manufacture and, more particularly, to a power SiGe heterojunction bipolar transistor (HBT) with improved drive current by strain compensation and methods of manufacture.

BACKGROUND

A bipolar power amplifier (using, e.g., a heterojunction bipolar transistors (HBT)) has a long drift base layer in a tradeoff of collector-emitter drive current for base control. A high Ge gradient in the base layer is concurrently used to provide drift fields for high-frequency operation. A total Ge dose (e.g., Ge concentration percentage over thickness), though, is well under a critical limit so that relaxation does not occur in the base layer. When relaxation occurs, ensuing dislocations generally thread through the entire base layer to a surface of a lower device layer (e.g., a collector layer), and the dislocations are electrically active. These dislocations form recombination centers for minority carriers, or provide short circuit paths between the collector layer and an emitter layer of the HBT. These effects increase a base current as well as a collector-emitter leakage, in the HBT.

Currently, the HBT is manufactured with only a single straining material including a compressive SiGe material in the base layer. Carbon incorporated in the base layer serves the purpose of only suppressing dopant diffusion, particularly, transient enhanced diffusion (TED). Accordingly, an amount of the carbon is low, e.g., $3E19$ $cm^{-3}$. However, under such a design, relaxation and ensuing dislocations in the HBT still can occur. In addition, the current HBT may not be useable for power amplifiers requiring higher current gain and higher-frequency operation.

Accordingly, there exists a need in the art to overcome the deficiencies and limitations described hereinabove.

SUMMARY

In a first aspect of the invention, a method includes adding carbon in a continuous steady concentration in layers of a device including a subcollector layer, a collector layer, a base buffer layer, a base layer, and an emitter buffer layer.

In another aspect of the invention, a method includes adding carbon in at least one of a subcollector layer, a collector layer, a base buffer layer, a base layer, and an emitter buffer layer, on a substrate. The carbon includes a concentration of greater than or equal to $5E20$ $cm^{-3}$.

In yet another aspect of the invention, a structure includes a subcollector layer in a substrate, a collector layer on the subcollector layer, a base buffer layer on the collector layer, a base layer on the base buffer layer, and an emitter buffer layer on the base layer. The subcollector layer, the collector layer, the base buffer layer, the base layer, and the emitter buffer layer, include carbon in a continuous steady concentration.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to a power SiGe heterojunction bipolar transistor (HBT) with improved drive current by strain compensation and methods of manufacture. More specifically, in embodiments, the present invention introduces carbon in a base layer of the power SiGe HBT, as well as in other layers (e.g., at least a subcollector layer) of the power SiGe HBT. Advantageously, this added carbon induces a tensile strain in the power SiGe HBT that compensates for all or portions of a compressive strain in the base layer induced by Ge in the base layer. For example, in the base layer, an amount of carbon may be just below a threshold (e.g., $5E20$ $cm^{-3}$) that would lead to precipitation in the power SiGe HBT. Further in the base layer, a thickness of the carbon may be widened to compensate for all or portions of compressive strain induced by the Ge contained therein.

In embodiments, the present invention can also incorporate a small to moderate amount (e.g., less than $5E20$ $cm^{-3}$) of carbon in an emitter buffer layer, a base buffer layer, a collector layer, and/or the subcollector layer, of the power SiGe HBT, that are, e.g., several thousands of angstroms (Å) thick. In the collector and the subcollector layers, for example, majority carriers are predominant, and precipitation may result in minor reduction of a majority current. However, thicknesses of the collector and the subcollector layers, including additional carbon, may tensily pre-strain a wafer of the power SiGe HBT to compensate for all or portions of the compressive strain in the base layer, in subsequent deposition steps. Advantageously, by compensating for all or portions of the compressive strain in the base layer, yield of the power SiGe HBT may be recovered from potential relaxation and ensuing dislocations in the power SiGe HBT. In addition, more Ge may be incorporated into the base layer for improved current gain and higher-frequency operation.

Figure 1A:
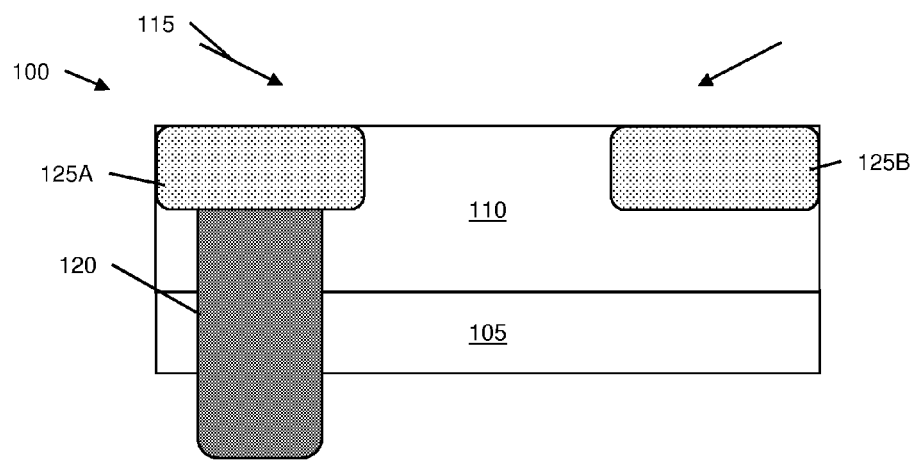
FIGS. 1A-1C show fabrication steps and respective structures in accordance with aspects of the invention.

FIG. 1A shows an exemplary cross-sectional view of a structure 100 and respective processing steps in accordance with aspects of the invention. The structure 100 includes a subcollector layer 105 and a collector layer 110 formed on the subcollector layer 105. In embodiments, the subcollector layer 105 can include a silicon substrate, and the collector layer 110 can be formed in the silicon substrate by, e.g., ion implantation of a N-dopant type species, such as phosphorous, antimony, arsenic, etc., for NPN-type HBTs. In alternative or additional embodiments, the collector layer 110 may be doped by a P-type species, such as boron, gallium, etc., for PNP-type HBTs. Carbon 115 is added as a carbon-containing precursor gas to a gas mixture during the formation (e.g., the epitaxy and/or deposition) of the subcollector layer 105, and the formation (e.g., the epitaxy, deposition, and/or ion implantation) of the collector layer 110. The added carbon 115 may include a concentration of less than about 1% (e.g., in atomic ratio per silicon) or $5E20$ $cm^{-3}$, preferably, about 0.2% or $1E20$ $cm^{-3}$, although other concentrations are contemplated by the invention. In alternative or additional embodiments, the added carbon may include a concentration of greater than or equal to about 1% or 5E20 cm$^{-3}$. In this way, the subcollector layer 105 and the collector layer 110 may include additional carbon concentration.

In embodiments, a deep trench isolation (DTI) 120 is formed through the collector layer 110 and the subcollector layer 105. For example, the DTI 120 can be formed by conventional lithographic, etching, and deposition processes. For example, a mask may be formed on the collector layer 110, and exposed to energy to form a pattern, e.g., openings. An etching process (e.g., a reactive ion etching (RIE) process) may then be performed to form the DTI 120 extending through the subcollector layer 105. A deposition process (e.g., a chemical vapor deposition (CVD) or a plasma-enhanced chemical vapor deposition (PECVD)) may then be used to deposit a material into the DTI 120. In embodiments, a polysilicon may be deposited in the DTI 120, and the polysilicon may be lined with an oxide. A chemical-mechanical polish (CMP) may then be performed to remove any excess material and to form a planar surface. In alternative or additional embodiments, the DTI 120 may be formed after the formation of the other components of the power SiGe HBT, and may include a silicon oxide.

In accordance with aspects of the invention, shallow trench isolations (STIs) 125A and 125B are formed in the collector layer 110. The STIs 125A and 125B can be formed by etching (e.g., RIE) and deposition processes, similar to the conventional processes noted above. The STIs 125A and 125B may be filled with oxide, for example. In embodiments, the collector layer 110 may be formed between and below the STIs 125A and 125B. The STI 125A may be formed over and in alignment with the DTI 120.

Figure 1B:
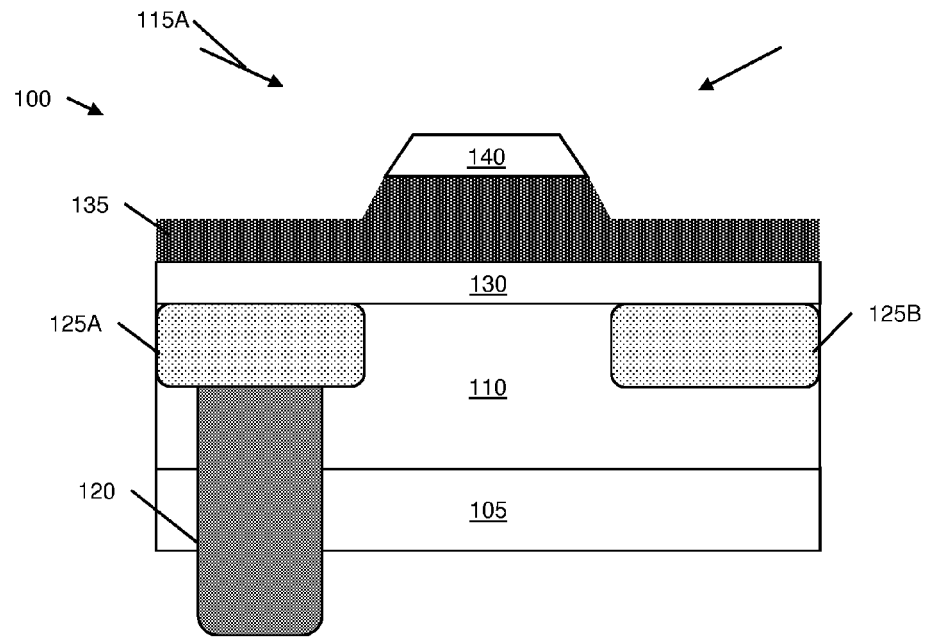

Referring to FIG. 1B, in embodiments, the structure 100 further includes a base buffer layer 130 formed on the collector layer 110 and the STIs 125A and 125B. A base layer 135 is formed on the base buffer layer 130. An emitter buffer layer 140 is formed on the base layer 135. Each of the base buffer layer 130, the base layer 135, and the emitter buffer layer 140 can include an epitaxially grown silicon layer. The base buffer layer 130 and the emitter buffer layer 140 may remain undoped, and may prevent diffusion into the base layer 135 during subsequent heating and/or annealing steps of the fabrication processes.

In embodiments, during the epitaxial growth of the base layer 135, a content profile of Ge, carbon (C), and boron (B), with either exponential or polynomial ramps, is created for the base layer 135 by time dependent programming of precursor gas flows in CVD and/or ion implantation processes. For example, as discussed below in FIG. 2, a Ge concentration in the base layer 135 can be graded such that the Ge concentration increases at a predetermined slope to a predetermined maximum value (at a predetermined depth in the base layer 135) and decreases at another predetermined slope to zero. In other examples, the base layer 135 may be doped with C, B, phosphorous (P), As, and/or Ga at respective predetermined concentrations and at predetermined depths, in the base layer 135.

In accordance with aspects of the invention, carbon 115A is added as a carbon-containing precursor gas to a gas mixture during the CVD of the base buffer layer 130, the base layer 135, and the emitter buffer layer 140. The added carbon 115A may include a concentration of less than about 1% or 5E20 cm$^{-3}$, preferably, about 0.2% or 1E20 cm$^{-3}$, although other concentrations are contemplated by the invention. In alternative or additional embodiments, the added carbon may include a concentration of greater than or equal to about 1% or 5E20 cm$^{-3}$. In this way, the base buffer layer 130, the base layer 135, and the emitter buffer layer 140 may include additional carbon concentration. In embodiments, the base layer 135 and the emitter buffer layer 140 may be partially etched using conventional lithographic and etching (e.g., RIE) processes, as discussed above, to form the structure of FIG. 1B.

Advantageously, the added carbon 115A in the subcollector layer 105, the collector layer 110, the base buffer layer 130, the base layer 135, and the emitter buffer layer 140 can prevent boron diffusion in the base layer 135 and induce a tensile strain that compensates for all or portions of the compressive strain induced by the Ge in the base layer 135. That is, the added carbon 115A may prevent relaxation in the structure 100 that causes formation of dislocations in the base layer 135. By preventing relaxation, the added carbon 115A may further prevent formation of recombination centers for minority carriers and short circuit paths between the collector layer 110 and an emitter layer. This results in yield gain, and the structure 100 may now operate in high-frequencies. In addition, the Ge in the base layer 135 may be increased due to the strain compensation of the added carbon 115A. This increased Ge may further improve current gain and high-frequency operation of the structure 100.

Figure 1C:
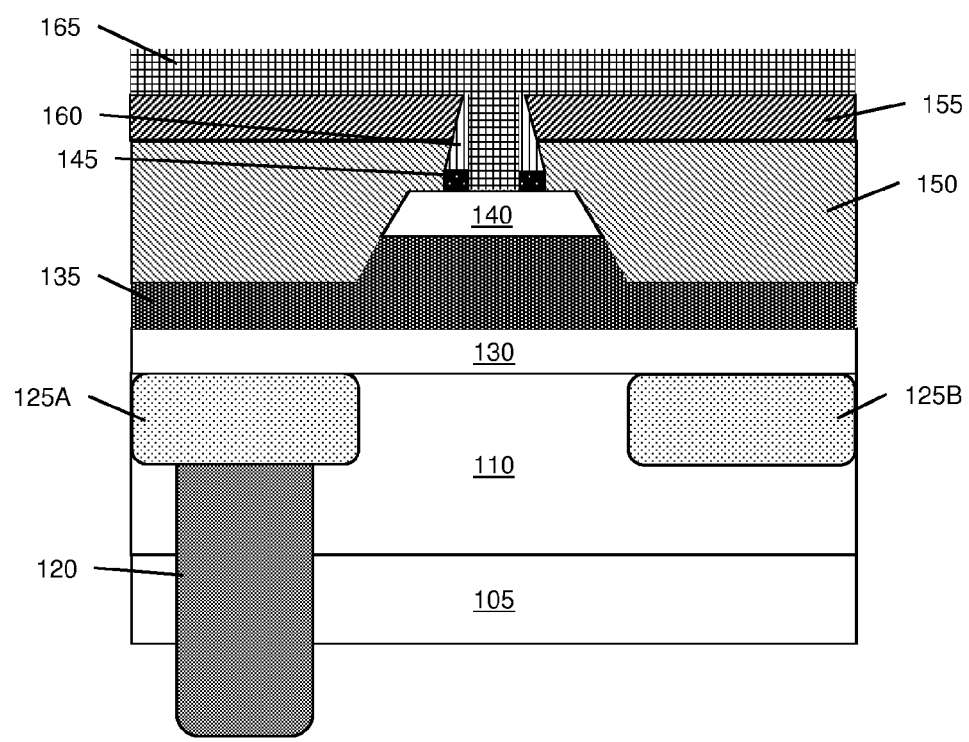

Referring to FIG. 1C, in embodiments, a dielectric layer 145 is formed on the emitter buffer layer 140, and may be partially etched using conventional lithographic and etching (e.g., RIE) processes, as discussed above. The dielectric layer 145 can include a silicon dioxide and/or a silicon nitride. An extrinsic base layer 150 is formed on the base layer 135, the emitter buffer layer 140, and the dielectric layer 145. In embodiments, the extrinsic base layer 150 can include a polysilicon, and can be doped by a P-type species, such as boron, gallium, etc., for NPN-type HBTs. In alternative or additional embodiments, the extrinsic base layer 150 may be of a N-type doping, such as phosphorous, arsenic, antimony, etc., for PNP-type HBTs. In embodiments, the extrinsic base layer 150 may be formed by a low pressure CVD (LPCVD) process. An oxide layer 155 is formed on the extrinsic base layer 150, using, e.g., CVD processes. The extrinsic base layer 150 and the oxide layer 155 may be etched using conventional lithographic and etching (e.g., RIE) processes.

In embodiments, sidewall spacers 160 are formed on the dielectric layer 145, and on sidewalls of the extrinsic base layer 150 and the oxide layer 155. At least one portion of the dielectric layer 145 can be removed (e.g., using RIE) to expose a surface of the emitter buffer layer 140. In this process, the sidewall spacers 160 may act as a mask protecting sidewalls of the extrinsic base layer 150 and the oxide layer 155, as well as the non-etched portion of the dielectric layer 145.

In accordance with further aspects of the invention, a T-shaped emitter layer 165 is formed through the oxide layer 155, the extrinsic base layer 150, and the dielectric layer 145. The T-shaped emitter layer 165 contacts, e.g., is in direct contact, with a surface of the oxide layer 155, the sidewall spacers 160, the dielectric layer 145, and the exposed surface of the emitter buffer layer 140. The T-shaped emitter layer 165 may be silicon, doped by a N-type species, such as phosphorous, antimony, arsenic, etc., for NPN-type HBTs. In alternative or additional embodiments, the T-shaped emitter layer 165 may be doped by a P-type species, such as boron, gallium, etc., for PNP-type HBTs. In embodiments, the T-shaped emitter layer 165 may be formed by LPCVD and/or ion implantation of the dopant species.

Figure 2:
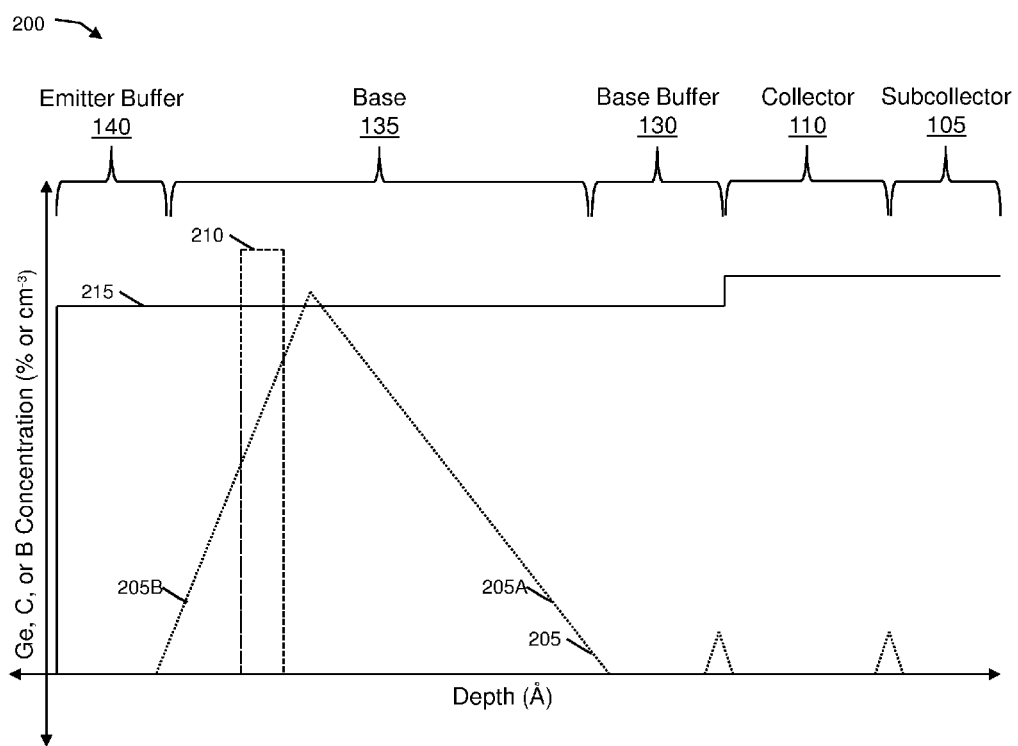
FIG. 2 shows an exemplary content profile of the power SiGe HBT in accordance with aspects of the invention.

FIG. 2 shows an exemplary content profile 200 of the structure 100 in FIG. 1C (e.g., a power SiGe heterojunction bipolar transistor) in accordance with aspects of the invention. An x-axis of the content profile 200 includes a depth of a power SiGe HBT in angstroms (Å), which can be zero at a bottom surface of the subcollector layer 105 in FIG. 1C and may increase in value from right to left through the collector layer 110, the base buffer layer 130, the base layer 135, and the emitter buffer layer 140. A y-axis of the content profile 200 includes a Ge, carbon (C), or boron (B) concentration in the layers of the power SiGe HBT in percentage (%) of atomic ratio per silicon, or in $cm^{-3}$. For example, when the power SiGe HBT is used in a power amplifier, the base layer 135 may include a Ge concentration 205 and/or a B concentration 210. The subcollector layer 105, the collector layer 110, the base buffer layer 130, the base layer 135, and the emitter buffer layer 140 may include a C concentration 215.

In embodiments, the Ge concentration 205 in the base layer 135 can be shallow in depth but long in gradient. For example, the base layer 135 may include the varying Ge concentration 205 between about 5% to about 30%. A maximum value of the Ge concentration 205 may be just below a critical concentration of Ge in the base layer 135 that may lead to relaxation or precipitation in the power SiGe HBT. One of skill in the art would recognize that these concentrations of the Ge concentration 205 are only exemplary, and other concentrations are contemplated by the invention, depending on the design structure of the power SiGe HBT. The Ge concentration 205 may include a first slope 205A and a second slope 205B. The B concentration 210 may be a maximum value between about $1E19\ cm^{-3}$ and about $5E20\ cm^{-3}$; although other concentrations are also contemplated by the invention.

In accordance with aspects of the invention, the power SiGe HBT can include a C concentration 215 in the emitter buffer layer 140, the base layer 135, the base buffer layer 130, the collector layer 110, and the subcollector layer 105, in a steady concentration through these layers, e.g., in a continuous fashion. That is, carbon may be incorporated in the entire content profile 200 (e.g., across a superlattice) of the power SiGe HBT. The C concentration 215 may be less than about 1% or $5E20\ cm^{-3}$, preferably, about 0.2% or $1E20\ cm^{-3}$; although other concentrations are contemplated by the invention. That is, the C concentration 215 may be higher than a threshold required for diffusion suppression in the power SiGe HBT (e.g., about $1E19\ cm^{-3}$), but less than a threshold resulting in precipitation in the power SiGe HBT (e.g., about 1.5% or $7.5E20\ cm^{-3}$).

This increased value for the C concentration 215 can prevent B diffusion and help to attain the high B concentration 210 in the base layer 135, in addition to inducing a tensile strain therein that compensates for all or portions of the compressive strain induced by the large Ge concentration 205 in the base layer 135. That is, the C concentration 215 will prevent relaxation in the power SiGe HBT that causes formation of dislocations in the base layer 135. In alternative or additional embodiments, the C concentration 215 may be greater than or equal to about 1% or $5E20\ cm^{-3}$, and/or may be greater in the collector layer 110 and the subcollector layer 105, as shown.

Advantageously, the increased value for the C concentration 215 (and its compensating compressive strain) can prevent precipitation in the power SiGe HBT, thereby reducing extraneous defects throughout the device; namely, in the base layer 135. For example, the C concentration 215 may prevent formation of recombination centers for minority carriers and short circuit paths between the collector layer 110 and an emitter layer, e.g., the emitter layer 165 in FIG. 1C. This results in yield gain, and the power SiGe HBT will operate in high-frequencies, according to design criteria. In addition, the critical concentration of the Ge may be increased due to the strain compensation of the increased C concentration 215 such that the Ge concentration 205 in the base layer 135 may also be increased. This increased Ge concentration 205 may further improve current gain and high-frequency operation of the power SiGe HBT.

Figure 3:
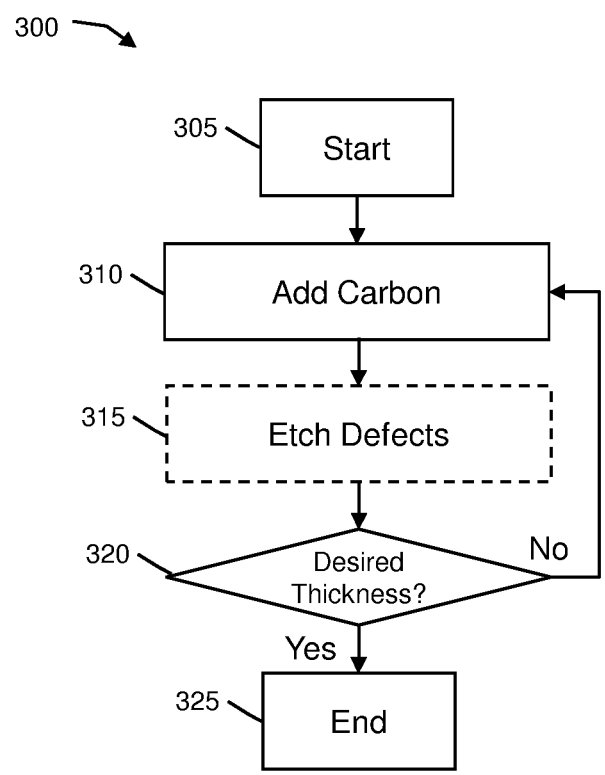
FIG. 3 is an exemplary flow diagram of processes of forming the power SiGe HBT in accordance with aspects of the invention.

FIG. 3 shows an exemplary flow for performing aspects of the present invention. The steps of FIG. 3 may be implemented in a semiconductor device fabrication environment, for example. The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the semiconductor device fabrication environment. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

FIG. 3 depicts an exemplary flow for a process 300 of forming a power SiGe heterojunction bipolar transistor (HBT) in accordance with aspects of the invention. In embodiments, the process 300 can be performed in the semiconductor device fabrication environment. At step 305, the process starts. At step 310, carbon is added as a carbon-containing precursor gas to a gas mixture during chemical vapor deposition (CVD) of and/or ion implantation in layers in the power SiGe HBT, e.g., the subcollector layer 105, the collector layer 110, the base buffer layer 130, the base layer 135, and the emitter buffer layer 140, of the structure 100, in FIG. 1C. In embodiments, the carbon-containing precursor gas can include a monomethyl silene, an ethylene, etc. The power SiGe HBT may be fabricated in a reduced-pressure CVD (RPCVD) (e.g., using a pressure of about 10-100 Torr (T)) or an ultra-high vacuum CVD (UHV/CVD) (e.g., using a pressure of less than about 1 mT).

In embodiments, the added carbon can include a concentration of less than about 1% or $5E20\ cm^{-3}$, preferably, about 0.2% or $1E20\ cm^{-3}$, although other concentrations are contemplated by the invention. These small to moderate amounts of the carbon incorporate naturally and completely (e.g., about 100%) in substitutional sites of crystal lattices of the silicon-containing layers (e.g., the base layer 135) in the power SiGe HBT, and thus, provide a small amount of strain on the power SiGe HBT. In alternative or additional embodiments, the added carbon may include a concentration of greater than or equal to about 1% or $5E20\ cm^{-3}$. After depositing about 100 Å of the layer(s) of the power SiGe HBT, these larger amounts of carbon do not incorporate naturally and completely in the substitutional sites of the crystal lattices of the silicon-containing layer(s) in the power SiGe HBT. Instead, the added carbon is increasingly incorporated in non-substitutional (e.g., interstitial) sites of the crystal lattices, and as precipitates (e.g., beta SiC clusters). Further, the larger amounts of carbon cause the layer(s) of the power SiGe HBT to become defective, even amorphous, due to the influence of the carbon.

Accordingly, at optional step 315, defects in the deposited layer(s) of the power SiGe HBT can be etched (e.g., removed) when the added carbon includes a concentration of greater than or equal to about 1% or $5E20\ cm^{-3}$. In embodiments, this etching may be performed after about 50 Å of the layer(s) of the power SiGe HBT are deposited. The etching may include an in-situ etch using HCl, $Cl_2$, $GeH_4$+HCl, etc. The etching may remove up to about 50% of the deposited layer(s) of the power SiGe HBT. Depending on a temperature of a substrate of the power SiGe HBT, actual pressure values, etching amounts, and deposition amounts may be non-selective or selective to dielectric materials and other amorphous or poly-crystalline materials, of the power SiGe HBT, as understood by one of skill in the art. Advantageously, the etching allows the larger amounts of carbon, along with dopants (e.g., phosphorous (P), As, boron (B), and/or Ga), to incorporate about 100% in the substitutional sites of the crystal lattices of the power SiGe HBT silicon layer(s).

At step 320, the process determines whether a desired thickness of the layer(s) of the power SiGe HBT is achieved. If so, the process continues at step 325. Otherwise, the process returns to step 310, where a new cycle of depositing layer(s) (e.g., adding carbon to layer(s)) of the power SiGe HBT and etching away resulting defects begins. At step 325, the process ends.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    adding carbon in a continuous steady concentration in layers of a device comprising a subcollector layer, a collector layer, a base buffer layer, a base layer, and an emitter buffer layer;
    forming a deep trench isolation structure in the collector layer and entirely through the subcollector layer; and
    forming one more shallow trench isolation structures in the collector layer,
    wherein a first shallow trench isolation structure of the one more shallow trench isolation structures is aligned with the deep trench isolation structure.

2. The method of claim 1, wherein the carbon comprises a concentration of $5E20\ cm^{-3}$.

3. The method of claim 1, wherein the carbon comprises a concentration of $1E20\ cm^{-3}$.

4. The method of claim 1, wherein the carbon comprises a concentration greater than a threshold required for diffusion suppression in a heterojunction bipolor transistor (HBT), and less than a threshold resulting in precipitation in the HBT.

5. The method of claim 1, wherein the carbon comprises a concentration greater than $1E19\ cm^{-3}$, and less than $7.5E20\ cm^{-3}$.

6. The method of claim 1, wherein the carbon comprises a concentration such that the carbon induces a tensile strain in the base layer that compensates for at least portions of a compressive strain induced by Ge in the base layer.

7. The method of claim 1, wherein the carbon comprises a concentration greater than $5E20\ cm^{-3}$.

8. The method of claim 1, wherein the carbon is added as a carbon-containing precursor gas to a gas mixture during forming of the subcollector layer, the collector layer, the base buffer layer, the base layer, and the emitter buffer layer.

9. The method of claim 8, wherein the carbon-containing precursor gas comprises at least one of a monomethyl silene and an ethylene.

10. The method of claim 1, further comprising forming the subcollector layer, the collector layer, the base buffer layer, the base layer, and the emitter buffer layer using at least one of a reduced-pressure chemical vapor deposition (CVD) and an ultra-high vacuum CVD.

11. The method of claim 1, wherein the device comprises:
    the subcollector layer in a substrate;
    the collector layer on the subcollector layer;
    the base buffer layer on the collector layer;
    the base layer on the base buffer layer; and
    the emitter buffer layer on the base layer.

12. A method comprising:
    adding carbon in a continuous steady concentration in layers of a device comprising a subcollector layer, a collector layer, a base buffer layer, a base layer, and an emitter buffer layer, wherein at least one of the subcollector layer, the collector layer, the base buffer layer, the base layer, and the emitter buffer layer include one or more defects; and
    etching the one or more defects in at least one of the subcollector layer, the collector layer, the base buffer layer, the base layer, and the emitter buffer layer.

13. A method comprising:
    adding carbon in at least one of a subcollector layer, a collector layer, a base buffer layer, a base layer, and an emitter buffer layer, on a substrate, wherein:
the carbon comprise a concentration of greater than or equal to $5E20$ cm$^{-3}$,
at least one of the subcollector layer, the collector layer, the base buffer layer, the base layer, and the emitter buffer layer include one or more defects; and
the method further comprises etching the one or more defects in the at least one of the subcollector layer, the collector layer, the base buffer layer, the base layer, and the emitter buffer layer.

14. The method of claim 13, wherein the etching is performed after 50 angstroms (Å) of the at least one of the subcollector layer, the collector layer, the base buffer layer, the base layer, and the emitter buffer layer is deposited.

15. The method of claim 13, wherein the etching comprises an in-situ etch using at least one of HCl, Cl$_2$, and GeH$_4$+HCl.

16. The method of claim 13, wherein the etching removes less than or equal to 50% of the at least one of the subcollector layer, the collector layer, the base buffer layer, the base layer, and the emitter buffer layer.

17. The method of claim 13, wherein the carbon comprises the concentration of less than $7.5E20$ cm$^{-3}$.

* * * * *